(12) United States Patent
Komeiji et al.

(10) Patent No.: US 12,327,548 B2
(45) Date of Patent: Jun. 10, 2025

(54) SPEECH RECOGNITION APPARATUS, CONTROL METHOD, AND NON-TRANSITORY STORAGE MEDIUM

(71) Applicant: NEC Corporation, Tokyo (JP)

(72) Inventors: Shuji Komeiji, Tokyo (JP); Ryoji Yoshida, Tokyo (JP); Hitoshi Yamamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 287 days.

(21) Appl. No.: 17/797,497

(22) PCT Filed: Feb. 19, 2020

(86) PCT No.: PCT/JP2020/006578
§ 371 (c)(1),
(2) Date: Aug. 4, 2022

(87) PCT Pub. No.: WO2021/166129
PCT Pub. Date: Aug. 26, 2021

(65) Prior Publication Data
US 2023/0046763 A1 Feb. 16, 2023

(51) Int. Cl.
*G10L 15/16* (2006.01)
*G10L 15/06* (2013.01)
*G10L 19/00* (2013.01)

(52) U.S. Cl.
CPC ............ *G10L 15/16* (2013.01); *G10L 15/063* (2013.01); *G10L 19/00* (2013.01); *G10L 2019/0016* (2013.01)

(58) Field of Classification Search
CPC ....... G10L 15/16; G10L 15/063; G10L 19/00; G10L 2019/0016; H03M 7/30
See application file for complete search history.

(56) References Cited

U.S. PATENT DOCUMENTS

| 2018/0174589 A1 | 6/2018 | Choi et al. |
| 2019/0139540 A1 | 5/2019 | Kanda |
| 2021/0056954 A1 | 2/2021 | Karita et al. |

FOREIGN PATENT DOCUMENTS

| JP | 2015-075706 A | 4/2015 |
| JP | 2017-219769 A | 12/2017 |
| JP | 2019-133046 A | 8/2019 |

OTHER PUBLICATIONS

J. Drexler and J. Glass, "Combining End-to-End and Adversarial Training for Low-Resource Speech Recognition," 2018 IEEE Spoken Language Technology Workshop (SLT), Athens, Greece, 2018, pp. 361-368, doi: 10.1109/SLT.2018.8639541. (Year: 2018).*

(Continued)

*Primary Examiner* — Daniel C Washburn
*Assistant Examiner* — Penny L Caudle

(57) ABSTRACT

A speech recognition apparatus (2000) includes a first model (10) and a second model (20). The first model (10) is learned by training data with an audio frame as input data, and with, as correct answer data, compressed character string data acquired by encoding character string data represented by the audio frame. The second model (20) is a learned decoder (44) acquired by learning an autoencoder (40) being constituted of an encoder (42) converting input character string data into compressed character string data, and the decoder (44) converting, into character string data, the compressed character string data output from the encoder. The speech recognition apparatus (2000) inputs an audio frame to the first model (10), inputs, to the second model (20), compressed character string data output from the first model (10), and thereby generates character string data corresponding to the audio frame.

8 Claims, 5 Drawing Sheets

(56) References Cited

OTHER PUBLICATIONS

International Search Report for PCT Application No. PCT/JP2020/006578, mailed on Jul. 28, 2020.

* cited by examiner

SPEECH RECOGNITION APPARATUS, CONTROL METHOD, AND NON-TRANSITORY STORAGE MEDIUM

This application is a National Stage Entry of PCT/JP2020/006578 filed on Feb. 19, 2020, the contents of all of which are incorporated herein by reference, in their entirety.

TECHNICAL FIELD

The present invention relates to speech recognition.

BACKGROUND ART

A technique for converting a speech into a character string has been developed. For example, such a technique is utilized in order to automatically convert recorded data into text data, or achieve a voice search. For example, Patent Document 1 discloses a technique for performing speech recognition by use of an acoustic model based on an end-to-end type neural network.

RELATED DOCUMENT

Patent Document

Patent Document 1: Japanese Patent Application Publication No. 2017-219769

SUMMARY OF THE INVENTION

Technical Problem

The present inventor has found a new technique for performing speech recognition. One object of the invention of the present application is to provide a new technique for speech recognition.

Solution to Problem

A speech recognition apparatus of the present invention includes 1) a first conversion unit that inputs an acquired audio frame to a first model converting an audio frame into compressed character string data, and thereby generates the compressed character string data corresponding to the acquired audio frame; and 2) a second conversion unit that inputs the compressed character string data generated by the first conversion unit to a second model converting the compressed character string data into character string data, and thereby generates the character string data corresponding to the acquired audio frame.

A data size of the compressed character string data is smaller than a data size of the character string data.

The first model is a model learned by training data with an audio frame as input data, and with, as correct answer data, compressed character string data acquired by encoding character string data represented by the audio frame.

The second model is a learned decoder acquired by learning an autoencoder being constituted of an encoder converting input character string data into compressed character string data, and the decoder converting, into character string data, compressed character string data output from the encoder.

A control method of the present invention is executed by a computer. The control method includes 1) a first conversion step of inputting an acquired audio frame to a first model converting an audio frame into compressed character string data, and thereby generating the compressed character string data corresponding to the acquired audio frame; and 2) a second conversion step of inputting the compressed character string data generated by the first conversion unit to a second model converting the compressed character string data into character string data, and thereby generating the character string data corresponding to the acquired audio frame.

A data size of the compressed character string data is smaller than a data size of the character string data.

The first model is a model learned by training data with an audio frame as input data, and with, as correct answer data, compressed character string data acquired by encoding character string data represented by the audio frame.

The second model is a learned decoder acquired by learning an autoencoder being constituted of an encoder converting input character string data into compressed character string data, and the decoder converting, into character string data, compressed character string data output from the encoder.

A program of the present invention causes a computer to execute a control method of the present invention.

Advantageous Effects of Invention

The present invention provides a new technique for speech recognition.

DESCRIPTION OF EMBODIMENTS

Hereinafter, an example embodiment of the present invention is described by use of the drawings. Note that, a similar reference sign is assigned to a similar component in all the drawings, and description thereof is omitted accordingly. Moreover, unless otherwise specially described, each block represents, in each block diagram, not a configuration on a hardware basis but a configuration on a function basis. In the following description, unless otherwise specially described, various predetermined values (threshold values and the like) are previously stored in a storage apparatus being accessible from a functional configuration unit utilizing the values.

Example Embodiment 1

<Outline>

Figure 1:
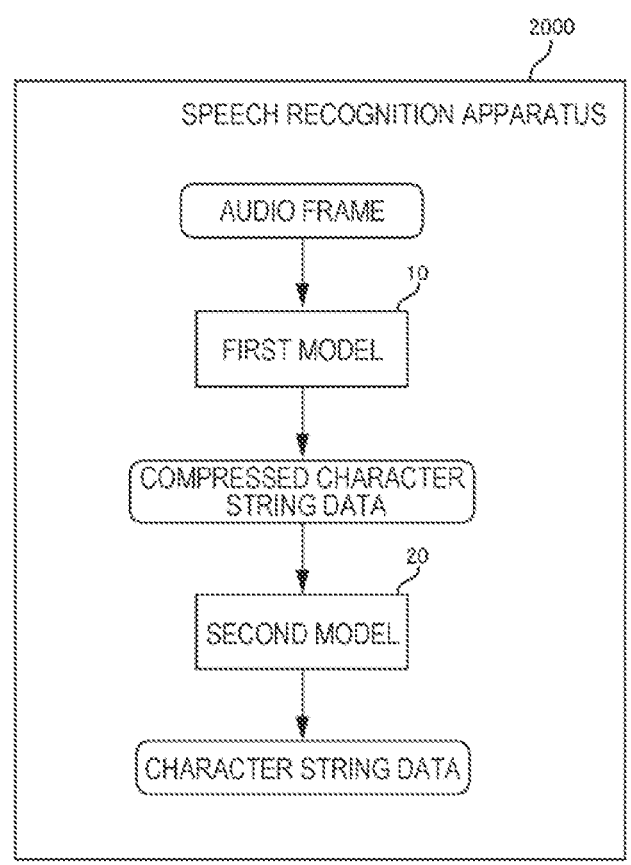
FIG. 1 is a diagram conceptually illustrating an operation of a speech recognition apparatus according to an example embodiment 1.

FIG. 1 is a diagram conceptually illustrating an operation of a speech recognition apparatus 2000 according to an example embodiment 1. Herein, the operation of the speech recognition apparatus 2000 described by use of FIG. 1 is an exemplification for easing understanding of the speech recognition apparatus 2000, and does not limit the operation of the speech recognition apparatus 2000. Details and a variation of the operation of the speech recognition apparatus 2000 are described later.

The speech recognition apparatus 2000 is utilized in order to convert a speech into a character string. More specifically, the speech recognition apparatus 2000 converts an audio frame into character string data. The audio frame is, for example, audio data acquired by extracting an audio signal in a partial time section from audio data (hereinafter, source data) recording an utterance of a person. The audio data are, for example, vector data or the like representing a waveform of an audio signal. The source data are, for example, recording data of a conversation or a speech, audio data of a search word input for a voice search, or the like.

Note that, regarding audio data acquired by extracting an audio signal in a partial time section from source data, extraction of an audio feature value may be performed, and data representing the audio feature value may be handled as an audio frame. As an audio feature value, various feature values such as a cepstrum feature value can be used.

Character string data are data representing a string of one or more characters. For example, character string data are a string of a character vector. For example, the character vector is a one-hot vector having the same length as the number of kinds of expressible characters. For example, it is assumed that N kinds (N is a natural number) of characters can be handled by character string data, and each character constituting character string data is represented by one one-hot vector. In this case, character string data is a string of a one-hot vector having a length N. Specifically, each different character is previously allocated to each bit of a character vector. Then, in each character vector constituting character string data, only a bit being related to a character expressed by the character vector is set to 1, and the other bits are set to 0. However, character string data may be data in a format being capable of expressing a character string desired to be expressed, and are not necessarily be achieved by utilizing a one-hot vector. Moreover, a word vector may be utilized instead of a character vector. Namely, each vector constituting character string data may be allowed to represent not one character but one word.

When converting an audio frame into character string data, the speech recognition apparatus 2000 first converts an audio frame into compressed character string data. Then, the speech recognition apparatus 2000 converts, into character string data, the compressed character string data acquired from the audio frame, and thereby generates character string data corresponding to the audio frame.

Compressed character string data are data having a data size smaller than that of character string data, and being capable of representing a character string represented by character string data. For example, when a character vector constituting character string data is a one-hot vector (N-bit vector) having a length N, a character vector constituting compressed character string data is a vector having a size smaller than an N-bit. For example, a case can be conceived where character string data and compressed character string data each represent a character string including kanji, and kinds of kanji that can be handled by the compressed character string data are fewer than kinds of kanji that can be handled by the character string data. In this case, the number of dimensions of a character vector constituting the compressed character string data is smaller than the number of dimensions of a character vector constituting the character string data.

Herein, conversion from an audio frame into compressed character string data is performed by use of a first model 10. Moreover, conversion from compressed character string data into character string data is performed by use of a second model 20.

Figure 2:
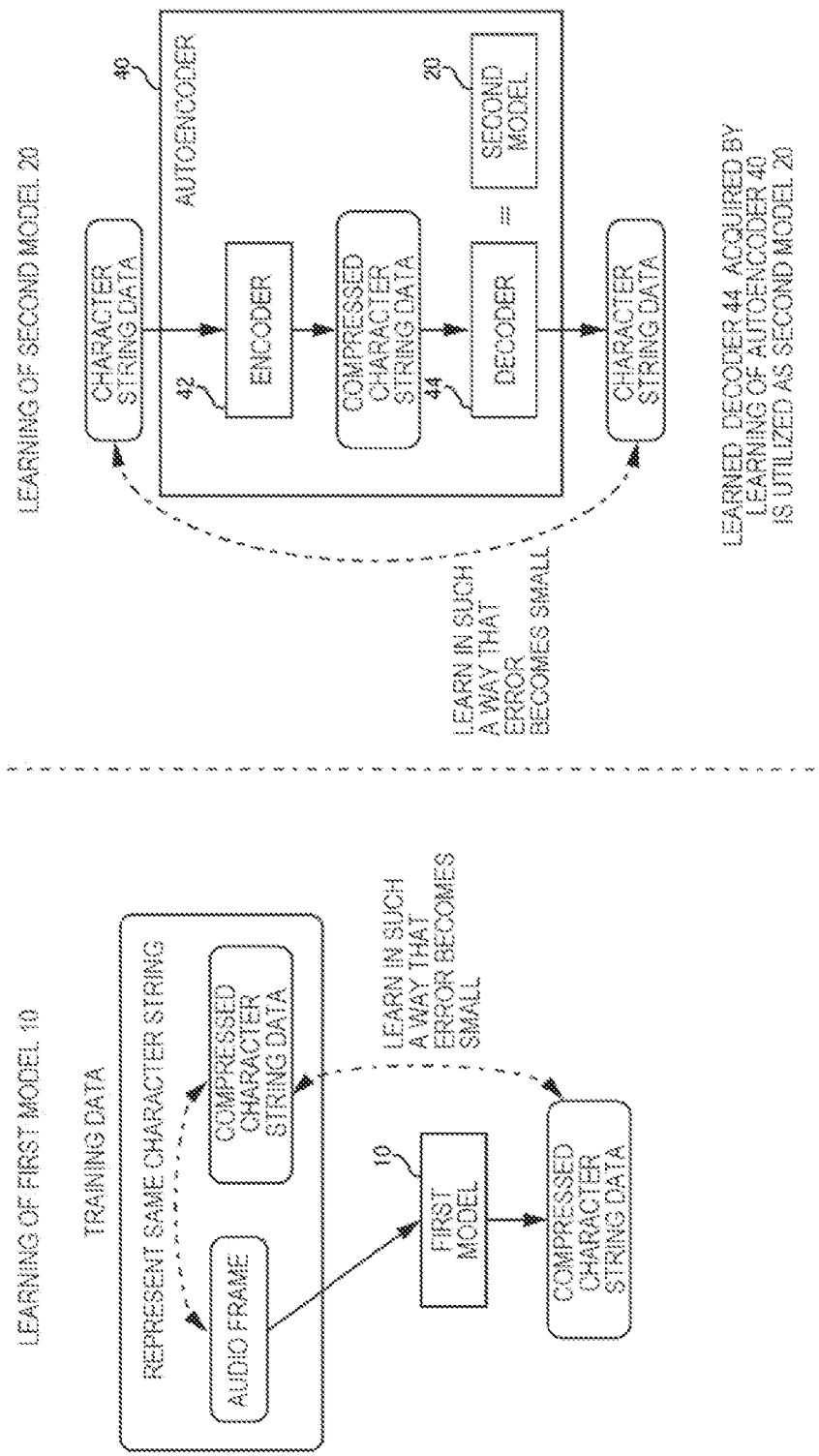
FIG. 2 is a diagram conceptually illustrating a learning method of a first model and a second model.

FIG. 2 is a diagram conceptually illustrating a learning method of the first model 10 and the second model 20. The first model 10 is a learned model learned in such a way as to convert an input audio frame into compressed character string data. Learning of the first model 10 is performed by use of training data including a pair of "an audio frame, and compressed character string data (compressed character string data acquired by encoding a character string represented by the audio frame) of a correct answer". Specifically, learning is performed in such a way as to reduce an error between compressed character string data output by the first model 10 in response to input of an audio frame, and compressed character string data of a correct answer associated with the audio frame.

The second model 20 is a learned model learned in such a way as to convert input compressed character string data into character string data. Learning of the second model 20 can be achieved by learning of an autoencoder 40 illustrated in FIG. 1. The autoencoder 40 has an encoder 42 and a decoder 44. The encoder 42 encodes character string data input to the autoencoder 40, and thereby converts the character string data into compressed character string data. On the other hand, the decoder 44 decodes the compressed character string data output by the encoder 42, and thereby converts the compressed character string data into character string data. Then, the character string data acquired by the decoder 44 are output from the autoencoder 40.

The autoencoder 40 is learned in such a way that an error between input character string data and output character string data becomes small. As a result of performing learning of the autoencoder 40, the decoder 44 is allowed to restore the compressed character string data to original character string data. This means that character string data are allowed to be represented by compressed character string data having a smaller size. Moreover, by learning of the autoencoder 40, an encoder that can convert character string data into compressed character string data, and a decoder that can convert compressed character string data into character string data can be acquired. As the second model 20, the learned decoder 44 acquired in this way is used.

One Example of Advantageous Effect

The speech recognition apparatus 2000 converts an audio frame into character string data, by use of the first model 10 learned in such a way as to convert an audio frame into compressed character string data, and the second model 20 learned in such a way as to convert compressed character string data into character string data. At least the second model 20 is achieved by a neural network. In this way, the present invention provides a new technique for performing speech recognition by use of a neural network.

Moreover, by causing an output of the first model 10 to be not ordinary character string data but compressed character string data, the number of parameters of a model can be decreased. This can improve processing speed in both learning and inference.

The speech recognition apparatus 2000 is described below in more detail.

Example of Functional Configuration

Figure 3:
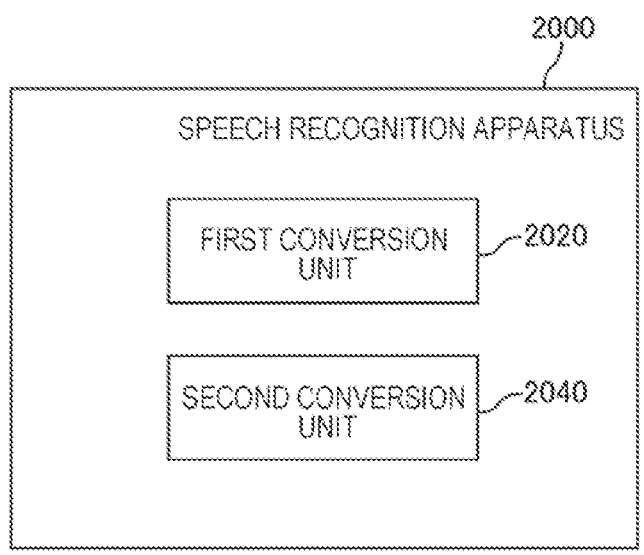
FIG. 3 is a block diagram illustrating a functional configuration of the speech recognition apparatus.

FIG. 3 is a block diagram illustrating a functional configuration of the speech recognition apparatus 2000. The speech recognition apparatus 2000 includes a first conversion unit 2020 and a second conversion unit 2040. The first conversion unit 2020 includes the first model 10. The first conversion unit 2020 acquires an audio frame, inputs the audio frame to the first model 10, and thereby converts the audio frame into compressed character string data. The second conversion unit 2040 includes the second model 20. The second conversion unit 2040 inputs, to the second model 20, compressed character string data acquired by utilizing the first conversion unit 2020 (compressed character string data corresponding to an audio frame acquired by the first conversion unit 2020), and thereby converts the compressed character string data into character string data. In consequence, character string data corresponding to the acquired audio frame are acquired.

Example of Hardware Configuration

Each functional configuration unit of the speech recognition apparatus 2000 may be achieved by hardware (example: a hard-wired electronic circuit, or the like) that achieves each functional configuration unit, or may be achieved by a combination of hardware and software (example: a combination of an electronic circuit and a program controlling the electronic circuit, or the like). A case where each functional configuration unit of the speech recognition apparatus 2000 is achieved by a combination of hardware and software is further described below.

Figure 4:
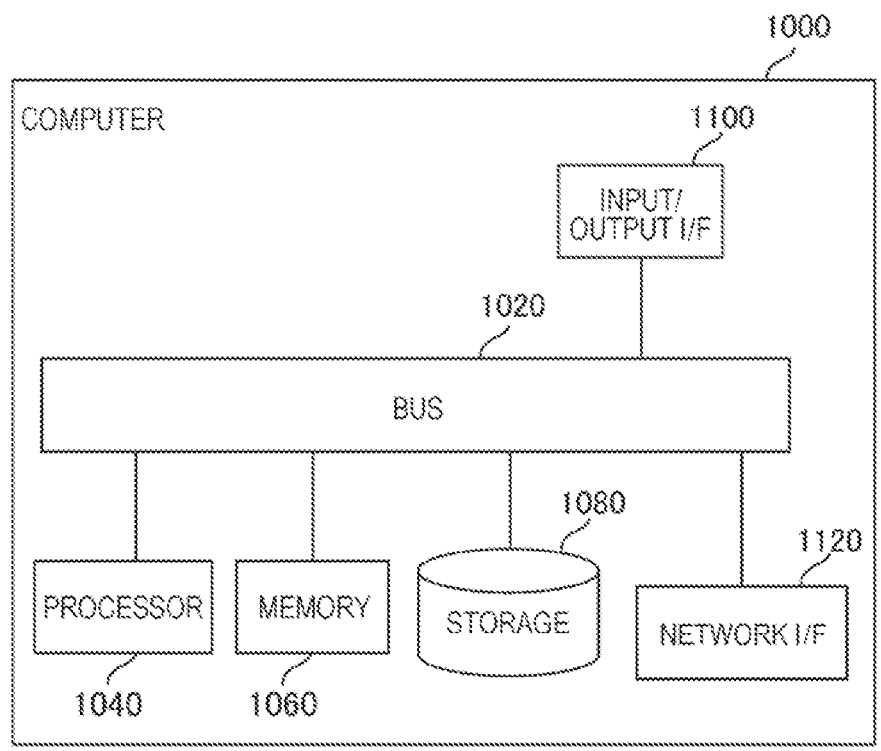
FIG. 4 is a diagram illustrating a computer for achieving the speech recognition apparatus.

FIG. 4 is a diagram illustrating a computer 1000 for achieving the speech recognition apparatus 2000. The computer 1000 is any computer. For example, the computer 1000 is a stationary computer such as a personal computer (PC) or a server machine. In another example, the computer 1000 is a portable computer such as a smartphone or a tablet terminal.

The computer 1000 may be a dedicated computer designed to achieve the speech recognition apparatus 2000, or may be a general-purpose computer. In the latter case, each function of the speech recognition apparatus 2000 is achieved in the computer 1000, for example, by installing a predetermined application in the computer 1000. The above-described application is configured by a program for achieving the functional configuration unit of the speech recognition apparatus 2000.

The computer 1000 includes a bus 1020, a processor 1040, a memory 1060, a storage device 1080, an input/output interface 1100, and a network interface 1120. The bus 1020 is a data transmission path through which the processor 1040, the memory 1060, the storage device 1080, the input/output interface 1100, and the network interface 1120 transmit/receive data to/from one another. However, a method of mutually connecting the processor 1040 and the like is not limited to bus connection.

The processor 1040 is various processors such as a central processing unit (CPU), a graphics processing unit (GPU), and a field-programmable gate array (FPGA). The memory 1060 is a main storage apparatus achieved by use of a random access memory (RAM) or the like. The storage device 1080 is an auxiliary storage apparatus achieved by use of a hard disk, a solid state drive (SSD), a memory card, a read only memory (ROM), or the like.

The input/output interface 1100 is an interface for connecting the computer 1000 and an input/output device with each other. For example, an input apparatus such as a keyboard and an output apparatus such as a display apparatus are connected to the input/output interface 1100.

The network interface 1120 is an interface for connecting the computer 1000 to a communication network. The communication network is, for example, a local area network (LAN) or a wide area network (WAN).

The storage device 1080 stores a program that achieves each functional configuration unit of the speech recognition apparatus 2000 (the above-described program that achieves the application). The processor 1040 reads each of the programs onto the memory 1060, executes the read program, and thereby achieves each functional configuration unit of the speech recognition apparatus 2000.

Herein, the speech recognition apparatus 2000 may be achieved by the single computer 1000, or may be achieved by a plurality of the computers 1000. In the latter case, for example, the speech recognition apparatus 2000 is achieved as a distributed system including one or more of the computers 1000 achieving the first conversion unit 2020, and one or more of the computers 1000 achieving the second conversion unit 2040.

<Flow of Processing>

Figure 5:
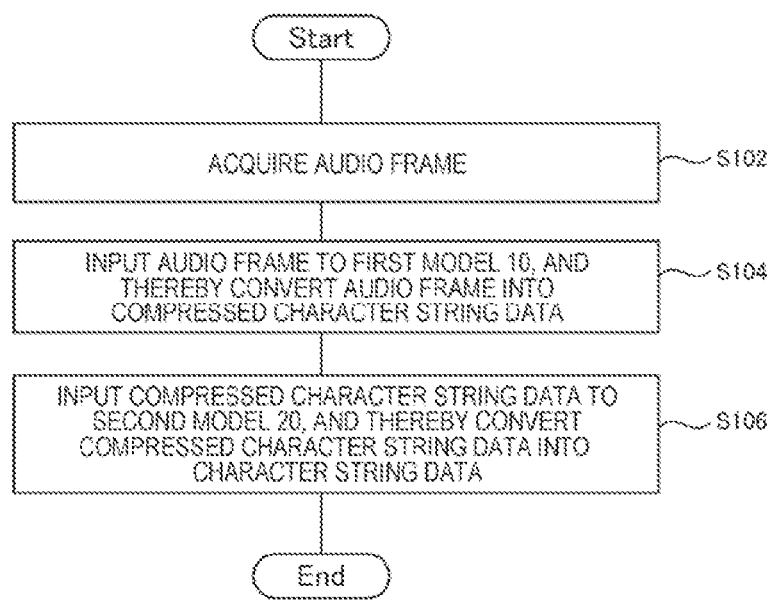
FIG. 5 is a flowchart illustrating a flow of processing executed by the speech recognition apparatus according to the example embodiment 1.

FIG. 5 is a flowchart illustrating a flow of processing executed by the speech recognition apparatus 2000 according to the example embodiment 1. The first conversion unit 2020 acquires an audio frame (S102). The first conversion unit 2020 inputs the audio frame to the first model 10, and thereby converts the audio frame into compressed character string data (S104). The second conversion unit 2040 inputs, to the second model 20, the compressed character string data acquired in S104, and thereby converts the compressed character string data into character string data (S106).

<Regarding Autoencoder 40>

As illustrated in FIG. 2, the autoencoder 40 is constituted of the encoder 42 and the decoder 44. The autoencoder 40 is achieved by, for example, a neural network. The encoder 42 is a model converting (encoding) input character string data into compressed character string data. The decoder 44 is a model converting (decoding), into character string data, compressed character string data output from the encoder 42.

Herein, the autoencoder 40 is configured in such a way that a data size of compressed character string data is smaller than a data size of character string data. Thus, the encoder 42 is configured in such a way that a size of data to be output is smaller than a size of data to be input. Such a configuration can be achieved by, for example, causing the number of nodes of an output layer to be smaller than the number of nodes of an input layer in the encoder 42. Moreover, the decoder 44 is configured in such a way that a size of data to be input is equal to a size of data to be output from the encoder 42 (i.e., is a size of compressed character string data), and a size of data to be output is equal to a size of data to be input to the encoder 42 (i.e., is a size of character string data). Such a configuration can be achieved by, for example, causing the number of nodes of an input layer of the decoder 44 to be equal to the number of nodes of an output layer of the encoder 42 (or, using the output layer of the encoder 42 as the input layer of the decoder 44), and causing the number of nodes of an output layer of the decoder 44 to be equal to the number of nodes of an input layer of the encoder 42.

Learning of the autoencoder 40 can be performed by utilizing a plurality of any kinds of character strings. An existing technique can be utilized for a specific technique for performing learning of the autoencoder 40.

However, since a data size of compressed character string data is smaller than a data size of character string data, the number of kinds of character strings that can be represented by compressed character string data in the single autoencoder 40, i.e., the number of kinds of character strings that can be handled by the single autoencoder 40 is smaller than the number of kinds of character strings being expressible by character string data. For example, it is assumed that character string data can represent 3000 kinds of character strings, whereas compressed character string data can represent only 1000 kinds of character strings. In this case, the number of kinds of character strings that can be handled by the single autoencoder 40 is 1000 kinds.

Accordingly, it is preferred to utilize, for learning of the autoencoder 40, a character string being highly probably included in source data desired to be analyzed in the speech recognition apparatus 2000. For example, it is assumed that the speech recognition apparatus 2000 is utilized in order to convert a file recording a meeting into a document file, in a company in a computer field, such as a software development company. In this case, an audio frame to be input to the speech recognition apparatus 2000 highly probably includes many technical terms in the computer field. Thus, in this case, it is preferred to utilize, for learning of the autoencoder 40, many character strings representing technical terms in the computer field.

Note that, as described later, a plurality of sets of models (sets of the first model 10, the second model 20 (=the encoder 42), and the decoder 44) may be prepared for each field or the like by preparing a plurality of the autoencoders 40. A pattern in which a plurality of sets of models are prepared in this way is described later.

<Regarding First Model 10>

The first model 10 is a learned model learned in such a way as to convert an input audio frame into compressed character string data. For a kind of model, any model can be utilized, such as a neural network or a support vector machine.

As described above, learning of the first model 10 is performed by use of a plurality of pieces of training data including a pair of "an audio frame, and compressed character string data of a correct answer". Note that, an existing technique can be utilized for a technique for performing learning of a model by use of a pair of input data and correct answer data being related thereto.

The above-described training data are an audio frame and compressed character string data corresponding to the same character string. Accordingly, training data can be generated by generating and associating an audio frame and compressed character string data corresponding to a certain character string.

Compressed character string data corresponding to a specific character string can be generated by utilizing, for example, the learned encoder 42. As described above, the encoder 42 converts character string data into compressed character string data. Thus, compressed character string data corresponding to a specific character string can be acquired by inputting the character string to the encoder 42. For example, compressed character string data corresponding to a character string "rain" can be acquired by preparing character string data representing the character string "rain", and inputting the character string data to the learned encoder 42.

An audio frame corresponding to a specific character string can be acquired by utilizing various existing methods. For example, by causing a person to actually utter a specific character string and recording the utterance, an audio frame representing an audio signal corresponding to the character string can be acquired. In another example, an audio frame representing an audio signal corresponding to a specific character string can be acquired by utilizing existing software converting character string data into audio data. For example, an audio frame corresponding to a character string "rain" can be acquired by recording a speech uttering a word "rain", or inputting character string data "rain" to software converting character string data into a speech. Note that, an audio frame representing an audio feature value corresponding to a specific character string can be generated by acquiring data representing an audio signal corresponding to a specific character string, and then converting the data into a feature value.

A pair of an audio frame and compressed character string data corresponding to any character string can be utilized as training data utilized for learning of the first model 10. However, as described above, the number of kinds of character strings that can be handled by the autoencoder 40 is smaller than the number of kinds of character strings being expressible by character string data. Accordingly, it is preferred to utilize, as training data, a pair of an audio frame and compressed character string data corresponding to a character string (i.e., a character string utilized for learning of the autoencoder 40) that can be handled by the autoencoder 40. In other words, it is preferred to generate training data by utilizing a character string utilized for learning of the autoencoder 40.

<Acquisition of Audio Frame>

The first conversion unit 2020 acquires an audio frame (S102). The audio frame is audio data representing an audio signal in which a partial time section of source data has been cut out, or is a feature value acquired from the audio data. Processing of generating an audio frame from source data may be performed by the speech recognition apparatus 2000, or may be performed by an apparatus other than the speech recognition apparatus 2000. In the former case, the speech recognition apparatus 2000 acquires source data, generates a plurality of audio frames from the source data, and converts each of the audio frames into character string data. On the other hand, in the latter case, the speech recognition apparatus 2000 acquires a plurality of audio frames acquired from source data by another apparatus, and converts each of the audio frames into character string data.

Note that, an existing technique can be utilized as a technique for generating a plurality of audio frames from source data such as recorded data when performing processing of converting a speech into a character string. For example, processing of generating an audio frame is processing of detecting a speech section (a section in which a speech is present) from source data, and sequentially extracting an audio signal included in a time window while moving the time window of a predetermined length from a head of the speech section at a constant time width. Each audio signal extracted in this way, or a feature value acquired from the audio signal is utilized as an audio frame.

<Output of Character String Data>

The speech recognition apparatus 2000 outputs generated character string data (S106). An output destination of the generated character string data is any output destination (e.g., a storage apparatus, a display apparatus, or the like).

Note that, there are various utilization methods of character string data acquired by utilizing the speech recognition apparatus 2000. For example, character string data acquired by utilizing the speech recognition apparatus 2000 are utilized in order to generate text data representing an utterance content of a meeting or a speech represented by source data (so-called transcription). In this case, the speech recognition apparatus 2000 sequentially converts, into character string data, a plurality of time-series audio frames extracted from source data. In consequence, a plurality of pieces of time-series character string data can be acquired. Text data are generated by utilizing a plurality of pieces of the time-series character string data acquired in this way. Herein, an existing technique can be utilized as a technique for generating text data representing an utterance content of a meeting or the like by utilizing a plurality of pieces of time-series character string data acquired from a plurality of time-series audio frames.

<Selection of Model According to Utilization Scene>

As described above, since a data size of compressed character string data is smaller than a data size of character string data, the number of kinds of character strings that can be handled by the single autoencoder 40 is smaller than the number of kinds of character strings being expressible by character string data. Consequently, kinds of character strings that can be handled by a set of learned models "the first model 10, and the second model 20 (=the decoder 44)" is smaller than the number of kinds of character strings being expressible by character string data.

Accordingly, it is preferred to prepare a set of learned models for each utilization scene, in such a way that a model to be utilized by the speech recognition apparatus 2000 can be selected according to a utilization scene of the speech recognition apparatus 2000. For example, it is assumed that the speech recognition apparatus 2000 is utilized in order to convert recorded data of a meeting into a text file. In this case, depending on which field persons in the meeting belong to, a bias arises in a variation of character strings appearing in a meeting. For example, many technical terms in the computer field appear in a meeting of persons in the computer field, whereas many technical terms in a medical field appear in a meeting of persons in the medical field.

Accordingly, in such a case, a set of learned models are prepared for each field. Specifically, a set of models utilized for recorded data in the computer field are learned by utilizing a plurality of character strings including many technical terms in the computer field. On the other hand, a set of learned models utilized for recorded data in the medical field are learned by utilizing a plurality of character strings including many technical terms in the medical field.

Various methods can be adopted as a method of selecting a set of models for each utilization scene. For example, a set of models are allowed to be switched in the single speech recognition apparatus 2000. In this case, identification information of a utilization scene (e.g., a field) and a set of learned models are previously stored in association with each other in a storage apparatus being accessible from the speech recognition apparatus 2000. The speech recognition apparatus 2000 provides a user with a screen for selecting a utilization scene. The speech recognition apparatus 2000 reads, from the storage apparatus, a set of learned models associated with a utilization scene selected by the user. Then, the first conversion unit 2020 and the second conversion unit 2040 each utilize the first model 10 and the second model 20 included in the read set of models. In consequence, conversion from an audio frame into character string data is performed by utilizing a learned model suited to the utilization scene selected by the user.

In another example, a plurality of the speech recognition apparatuses 2000 may be prepared, and each of the speech recognition apparatuses 2000 may be set to each different set of models. In this case, the speech recognition apparatus 2000 being related to a utilization scene is utilized. For example, a front-end machine that accepts a request from a user is prepared, and the machine provides the above-described selection screen. When a user selects a utilization scene in the selection screen, processing of acquiring character string data from audio data is performed by utilizing the speech recognition apparatus 2000 associated with the selected utilization scene.

As described above, in order to prepare a set of models for each utilization scene, learning of a model being related to each utilization scene is performed. For example, it is assumed that a set of models for handling a speech in the computer field, and a set of models for handling a speech in the medical field are prepared. In this case, the former set of models are learned by utilizing an audio frame and character string data being related to a speech in the computer field. For example, learning of the autoencoder 40 is performed by utilizing character string data representing each character string coming out in a conversation in the computer field, and thereby, the encoder 42 and the decoder 44 for handling a speech in the computer field can be acquired. Moreover, regarding each character string coming out in the conversation in the computer field, a pair of "an audio frame representing the character string, and compressed character string data acquired by inputting the character string to the encoder 42" are prepared, and learning of the first model 10 is performed by utilizing each of the prepared pairs. In consequence, the first model 10 for handling a speech in the computer field can be acquired. Then, by allowing the first conversion unit 2020 and the second conversion unit 2040 to each utilize the first model 10 and the second model 20 (the decoder 44) acquired in this way, the speech recognition apparatus 2000 is allowed to handle a speech in the computer field.

A set of models being related to speeches in various fields can be acquired by doing likewise regarding a speech in another field as well. Thus, the speech recognition apparatus 2000 is allowed to handle speeches in various fields.

Some or all of the above-described example embodiments can also be described as, but are not limited to, the following supplementary notes.

1. A speech recognition apparatus including:
   a first conversion unit that inputs an acquired audio frame to a first model converting an audio frame into compressed character string data, and thereby generates the compressed character string data corresponding to the acquired audio frame; and
   a second conversion unit that inputs the compressed character string data generated by the first conversion unit to a second model converting the compressed character string data into character string data, and thereby generates the character string data corresponding to the acquired audio frame, wherein
   a data size of the compressed character string data is smaller than a data size of the character string data,
   the first model is a model learned by training data with an audio frame as input data, and with, as correct answer data, compressed character string data acquired by encoding character string data represented by the audio frame, and
   the second model is a learned decoder acquired by learning an autoencoder being constituted of an encoder converting input character string data into compressed character string data, and the decoder converting, into character string data, compressed character string data output from the encoder.

2. The speech recognition apparatus according to supplementary note 1, wherein
   the audio frame is an audio feature value acquired from an audio signal.

3. The speech recognition apparatus according to supplementary note 1 or 2, wherein the compressed character string data to be utilized as the correct answer data are acquired by encoding, by use of the encoder, character string data corresponding to an audio frame to be included in the correct answer data.

4. A control method executed by a computer, including:
a first conversion step of inputting an acquired audio frame to a first model converting an audio frame into compressed character string data, and thereby generating the compressed character string data corresponding to the acquired audio frame; and
a second conversion step of inputting the compressed character string data generated by the first conversion unit to a second model converting the compressed character string data into character string data, and thereby generating the character string data corresponding to the acquired audio frame, wherein
a data size of the compressed character string data is smaller than a data size of the character string data,
the first model is a model learned by training data with an audio frame as input data, and with, as correct answer data, compressed character string data acquired by encoding character string data represented by the audio frame, and
the second model is a learned decoder acquired by learning an autoencoder being constituted of an encoder converting input character string data into compressed character string data, and the decoder converting, into character string data, compressed character string data output from the encoder.

5. The control method according to supplementary note 4, wherein
the audio frame is an audio feature value acquired from an audio signal.

6. The control method according to supplementary note 4 or 5, wherein
the compressed character string data to be utilized as the correct answer data are acquired by encoding, by use of the encoder, character string data corresponding to an audio frame to be included in the correct answer data.

7. A program causing a computer to execute the control method according to any one of supplementary notes 4 to 6.

REFERENCE SIGNS LIST

10 First model
20 Second model
40 Autoencoder
42 Encoder
44 Decoder
1000 Computer
1020 Bus
1040 Processor
1060 Memory
1080 Storage device
1100 Input/output interface
1120 Network interface
2000 Speech recognition apparatus
2020 First conversion unit
2040 Second conversion unit

The invention claimed is:

1. A speech recognition apparatus comprising:
at least one memory storing instructions; and
at least one processor configured to execute the instructions to perform operations comprising:
inputting an acquired audio frame to a first model converting an audio frame into compressed character string data to thereby generate the compressed character string data corresponding to the acquired audio frame; and
inputting the compressed character string data to a second model converting the compressed character string data into character string data to thereby generate the character string data corresponding to the acquired audio frame, wherein
a data size of the compressed character string data is smaller than a data size of the character string data,
the first model is a model learned by training data with an audio frame as input data, and with, as correct answer data, compressed character string data acquired by encoding character string data represented by the audio frame,
the second model is a learned decoder acquired by learning an autoencoder being constituted of an encoder converting input character string data into compressed character string data, the decoder converting, into character string data, compressed character string data output from the encoder,
a character vector constituting the character string data is a N-bit vector, and
a character vector constituting the compressed character string data is a vector having a size smaller than an N-bit.

2. The speech recognition apparatus according to claim 1, wherein
the audio frame is an audio feature value acquired from an audio signal.

3. The speech recognition apparatus according to claim 1, wherein
the compressed character string data to be utilized as the correct answer data in the training data are acquired by encoding, by use of the encoder, character string data corresponding to an audio frame to be included in the training data.

4. The speech recognition apparatus according to claim 1, wherein
the first model is the model further learned by
calculating an error between compressed character string data output by the first model in response to input of the input data included in the training data, and the correct answer data associated with the input data, and
reducing the calculated error.

5. A control method performed by a computer and comprising:
inputting an acquired audio frame to a first model converting an audio frame into compressed character string data to thereby generate the compressed character string data corresponding to the acquired audio frame; and
inputting the compressed character string data to a second model converting the compressed character string data into character string data to thereby generate the character string data corresponding to the acquired audio frame, wherein
a data size of the compressed character string data is smaller than a data size of the character string data,
the first model is a model learned by training data with an audio frame as input data, and with, as correct answer data, compressed character string data acquired by encoding character string data represented by the audio frame,
the second model is a learned decoder acquired by learning an autoencoder being constituted of an encoder converting input character string data into compressed character string data, the decoder converting, into character string data, compressed character string data output from the encoder, a character vector constituting the character string data is a N-bit vector, and a character vector constituting the compressed character string data is a vector having a size smaller than an N-bit.

6. The control method according to claim 5, wherein the audio frame is an audio feature value acquired from an audio signal.

7. The control method according to claim 5, wherein the compressed character string data to be utilized as the correct answer data are acquired by encoding, by use of the encoder, character string data corresponding to an audio frame to be included in the correct answer data.

8. A speech recognition apparatus comprising:

at least one memory storing instructions; and at least one processor configured to execute the instructions to perform operations comprising:

inputting an acquired audio frame to a first model converting an audio frame into compressed character string data to thereby generate the compressed character string data corresponding to the acquired audio frame; and inputting the compressed character string data to a second model converting the compressed character string data into character string data to thereby generate the character string data corresponding to the acquired audio frame, wherein a data size of the compressed character string data is smaller than a data size of the character string data, the first model is a model learned by training data with an audio frame as input data, and with, as correct answer data, compressed character string data acquired by encoding character string data represented by the audio frame, the second model is a learned decoder acquired by learning an autoencoder being constituted of an encoder converting input character string data into compressed character string data, the decoder converting, into character string data, compressed character string data output from the encoder, and a number of nodes of an input layer in the decoder is smaller than a number of nodes of an output layer in the decoder.

* * * * *